United States Patent
Fang et al.

(10) Patent No.: US 9,472,674 B2
(45) Date of Patent: Oct. 18, 2016

(54) THIN FILM TRANSISTOR WITH TWO GATES PROTRUDING FROM SCAN LINE UNDER A DOUBLE-LAYER CHANNEL

(71) Applicant: HON HAI PRECISION INDUSTRY CO., LTD., New Taipei (TW)

(72) Inventors: Kuo-Lung Fang, New Taipei (TW);
Po-Li Shih, New Taipei (TW);
Yi-Chun Kao, New Taipei (TW);
Hsin-Hua Lin, New Taipei (TW);
Chih-Lung Lee, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/847,710

(22) Filed: Sep. 8, 2015

(65) Prior Publication Data
US 2016/0190341 A1   Jun. 30, 2016

(30) Foreign Application Priority Data
Dec. 31, 2014   (TW) ............... 103146403 A

(51) Int. Cl.
*H01L 27/12*   (2006.01)
*H01L 29/417*   (2006.01)
*H01L 29/786*   (2006.01)

(52) U.S. Cl.
CPC ....... *H01L 29/78645* (2013.01); *H01L 27/124* (2013.01); *H01L 29/41733* (2013.01); *H01L 29/41758* (2013.01); *H01L 29/7869* (2013.01); *H01L 29/78669* (2013.01); *H01L 29/78678* (2013.01); *H01L 29/78696* (2013.01)

(58) Field of Classification Search
CPC .......... H01L 27/124; H01L 29/41733; H01L 29/78645; H01L 29/78696
See application file for complete search history.

(56) References Cited

U.S. PATENT DOCUMENTS

| | | | | |
|---|---|---|---|---|
| 8,945,981 | B2* | 2/2015 | Yamazaki | H01L 27/1225 257/E29.296 |
| 2002/0000551 | A1* | 1/2002 | Yamazaki | H01L 29/42384 257/59 |
| 2015/0102336 | A1* | 4/2015 | Kang | H01L 27/1225 257/43 |

* cited by examiner

*Primary Examiner* — Thanh V Pham
(74) *Attorney, Agent, or Firm* — Zhigang Ma

(57) ABSTRACT

A thin film transistor includes a first gate electrode located on a base, a second gate electrode located on the base, an insulating layer, a source electrode, a drain electrode, and a channel layer. The insulating layer covers the base, the first gate electrode, and the second gate electrode. The second gate electrode is insulated from the first gate electrode. The channel layer includes a first portion and a second portion sandwiched between the first portion and the insulating layer. A conductivity of the second portion is larger than a conductivity of the first portion. The first portion includes a first region facing the first gate electrode and a second region facing the second gate electrode. The source electrode is electrically connected to the first region, and the drain electrode is electrically connected to the second region.

20 Claims, 5 Drawing Sheets

THIN FILM TRANSISTOR WITH TWO GATES PROTRUDING FROM SCAN LINE UNDER A DOUBLE-LAYER CHANNEL

CROSS-REFERENCE TO RELATED APPLICATIONS

This application claims priority to Taiwanese Patent Application No. 103146403 filed on Dec. 31, 2014, the contents of which are incorporated by reference herein.

FIELD

The subject matter herein generally relates to a thin film transistor and a thin film transistor substrate.

BACKGROUND

Large size display devices are part of everyday life. The display device includes a display panel with a number of thin film transistors (TFTs). The number of the TFTs increases according to the size of the display device.

BRIEF DESCRIPTION OF THE FIGURES

Implementations of the present technology will now be described, by way of example only, with reference to the attached figures.

DETAILED DESCRIPTION

Figure 1:
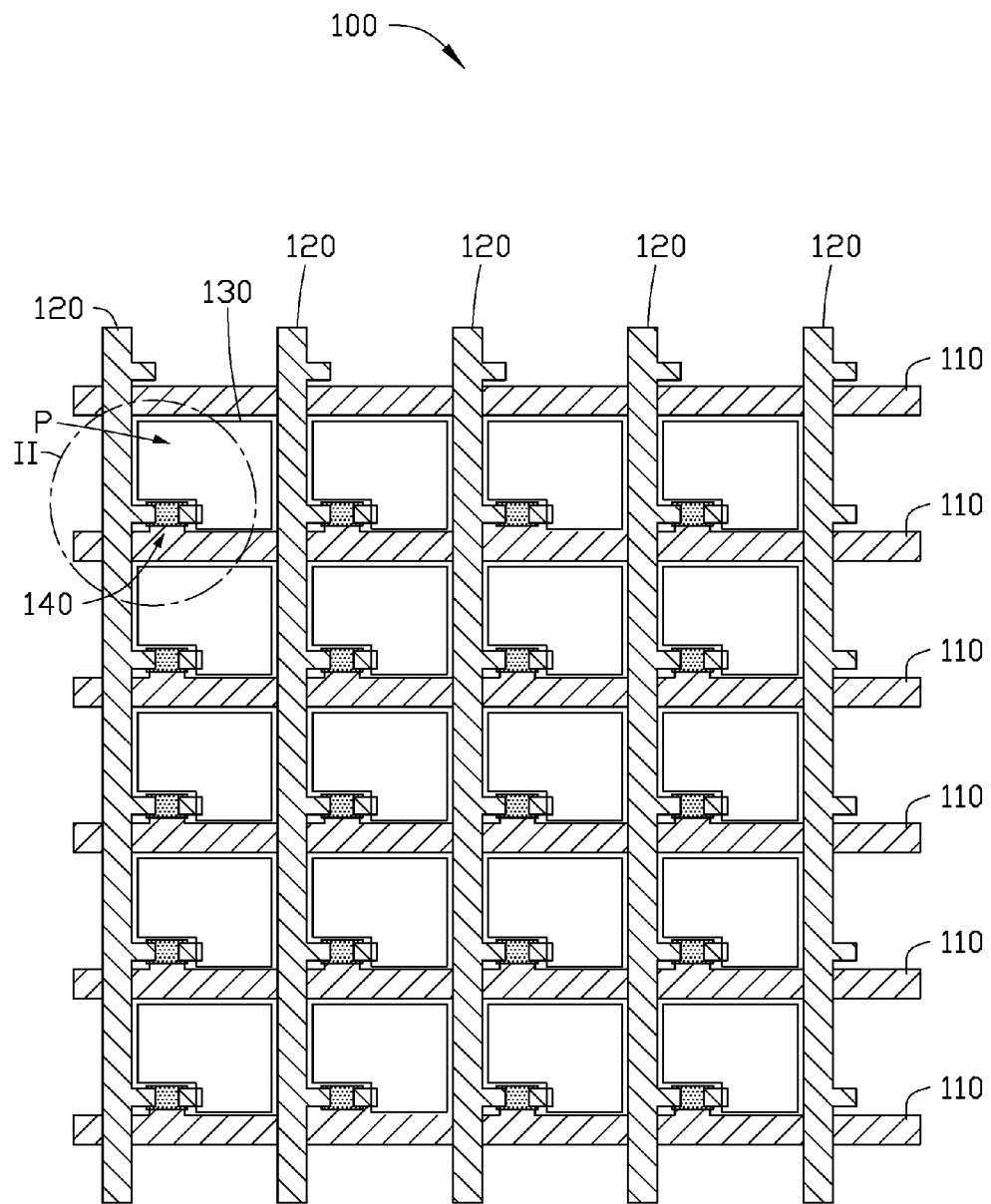
FIG. 1 is a diagram view of an embodiment of a thin film transistor (TFT) substrate; the TFT substrate comprises a plurality of TFTs.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series, and the like.

FIG. 1 illustrates a thin film transistor (TFT) substrate 100. The TFT substrate 100 includes a plurality of scan lines 110 parallel with each other, a plurality of data lines 120 parallel with each other, a plurality of pixel regions P, and a plurality of TFTs 140. The data lines 120 are perpendicular to the scan lines 110 and insulated from the scan lines 110. The pixel regions P are defined by the intersecting scan lines 110 and the data lines 120. Each of the pixel regions P corresponds to a pixel with a pixel electrode 130. The TFTs 140 are located at the intersection of the scan lines 110 and the data lines 120.

Figure 2:
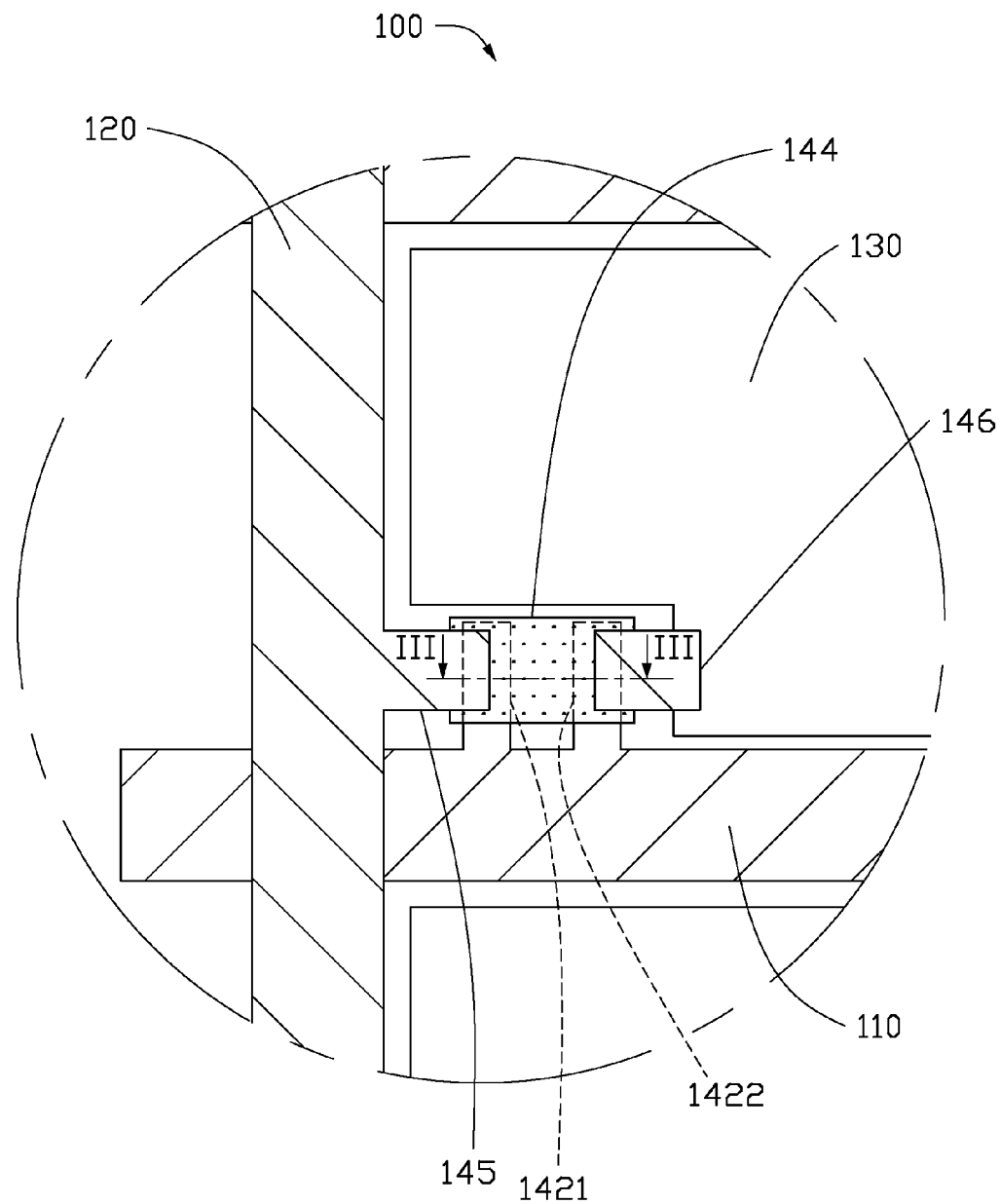
FIG. 2 is an enlarged view of encircled portion II of FIG. 1.

FIG. 2 illustrates an embodiment of the TFT 140. The TFT 140 includes a first gate electrode 1421, a second gate electrode 1422, a channel layer 144, a source electrode 145, and a drain electrode 146. The first gate electrode 1421 and the second gate electrode 1422 are extended from the scan line 110 and protruded along a direction perpendicular to the scan line 110.

Figure 3:
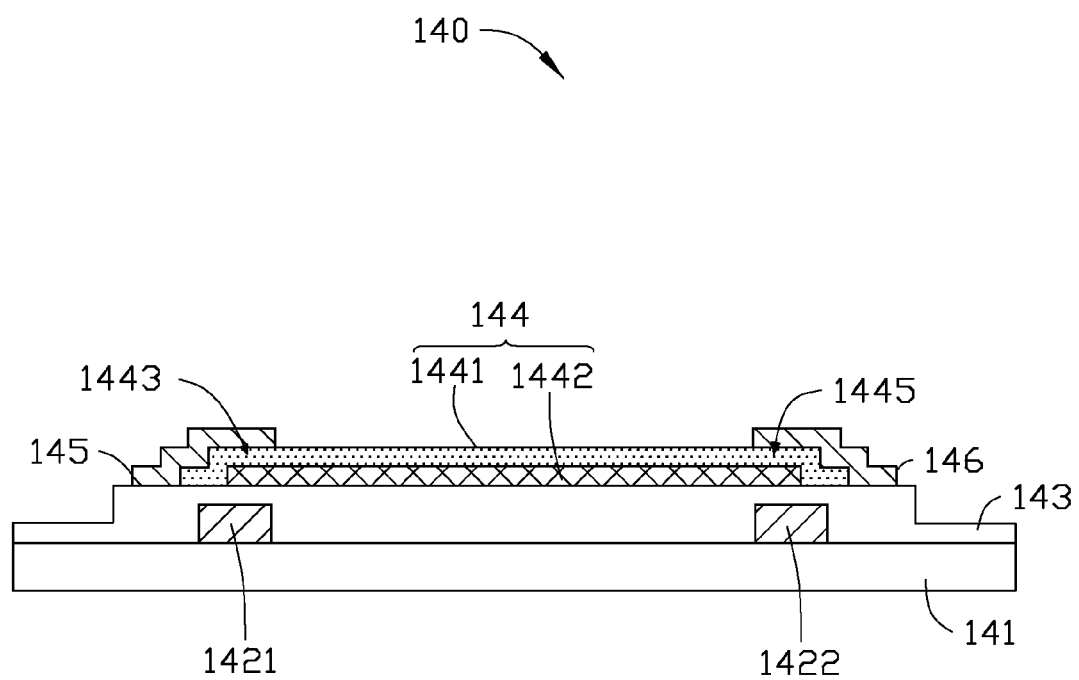
FIG. 3 is a cross-sectional view of a first embodiment of the TFT of FIG. 1.

FIG. 3 illustrates a cross-sectional embodiment of the TFT 140. The TFT 140 further includes a base 141 and an insulating layer 143. The first gate electrode 1421 and the second gate electrode 1422 are located on the base 141. The insulating layer 143 covers the base 141, the first gate electrode 1421, and the second gate electrode 1422. The channel layer 144 is located on an upper surface of the insulating layer 143 away from the base 141. The source electrode 145 and the drain electrode 146 are formed on the channel layer 144, and cover opposite ends and sidewalls of the channel layer 144 respectively. The source electrode 145 and the drain electrode 146 are substantially stepped shape. The scan line 110 is electrically connected to the first gate electrode 1421 and the second gate electrode 1422, and is located on the base 141. The data line 120 is electrically connected to the source electrode 145, and is located on the insulating layer 143.

The channel layer 144 includes a first portion 1441 and a second portion 1442. The first portion 1441 and the second portion 1442 are arranged overlapping on the insulating layer 143. The second portion 1442 is sandwiched between the first portion 1441 and the insulating layer 143. The first portion 1441 covers an upper surface and sidewalls of the second portion 1442. Two opposite ends of the first portion 1441 are substantially stepped shaped. The first portion 1441 includes a first region 1443 facing the first gate electrode 1421 and a second region 1445 facing the second gate electrode 1422. The first region 1443 is sandwiched between the source electrode 145 and the second portion 1442. The second region 1445 is sandwiched between the drain electrode 146 and the second portion 1442. In at least one embodiment, projections of the source electrode 145 and the drain electrode 146 on the insulating layer 143 are partly overlapping with the second portion 1442 respectively. The first portion 1441 is made of oxide semiconductor material, amorphous silicon or polycrystalline silicon semiconductor material. The second portion 1442 is made of conductive material, such as aluminum, titanium, molybdenum, tantalum, cooper, and so on. In other embodiments, the second portion 1442 is made of transparent conductive material, such as tin indium oxide (ITO), zinc indium oxide, and so on.

The first portion 1441 becomes conductive when voltages are provided on the first gate electrode 1421 and the second gate electrode 1421. A conductivity of the second portion 1442 is larger than a conductivity of the first portion 1441. An electron mobility of the second portion 1442 is larger than an electron mobility of the first portion 1441. When a voltage being provided to the TFT 140, based on the electron mobility and the conductivity of the first portion 1441 and the second portion 1442, a current of the source electrode 145 passes the first region 1443, the second portion 1442, and the second region 1445 orderly to the drain electrode 146. Meanwhile, a projection of the source electrode 145 on the insulating layer 143 is partly overlapping with the second portion 1442, thus a distance between the source electrode 145 and the second portion 1442 is decreased, and a distance between the drain electrode 146 and the second portion 1442 is decreased. Further, the second portion 1442 is used for establishing an electrical connection between the source electrode 145 and the drain electrode 146. As a result, a response speed of the TFT 140 is improved, and a weight of the TFT substrate 100 is decreased. While forming the channel layer 144, a first conductive layer (not shown) is formed on the insulating layer 143, and is etched to form the second portion 1442. A second conductive layer (not shown) is formed on the second portion 1442, and is etched to form the first portion 1441.

Figure 4:
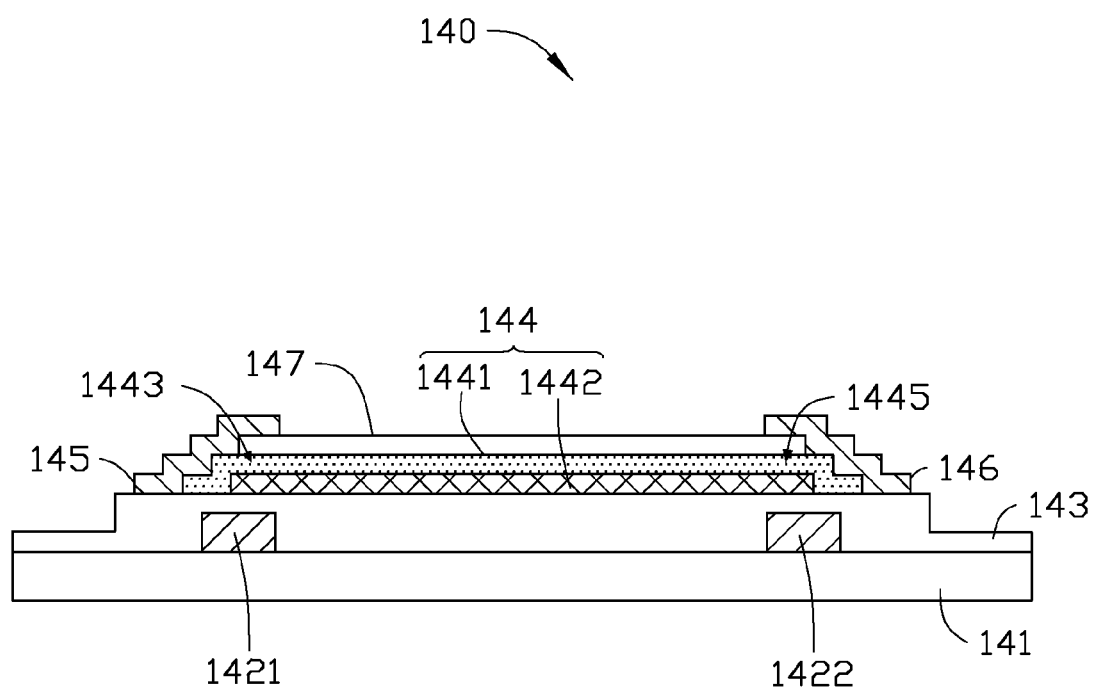
FIG. 4 is a cross-sectional view of a second embodiment of the TFT of FIG. 1.

FIG. 4 illustrates a second embodiment of the TFT 140. The TFT 140 further includes an etching barrier layer 147. The first gate electrode 1421 and the second gate electrode 1422 are located on the base 141. The insulating layer 143 covers the base 141, the first gate electrode 1421, and the second gate electrode 1422. The channel layer 144 is located on an upper surface of the insulating layer 143 away from the base 141. The source electrode 145 and the drain electrode 146 are formed on the channel layer 144. The source electrode 145 covers an end of the channel layer 144 and an end of the etching barrier layer 147 adjacent to the end of the channel layer 144 covered by the source electrode 145 simultaneously. The drain electrode 146 covers another end of the channel layer 144 and another end of the etching barrier layer 147 adjacent to another end of the channel layer 144 covered by the drain electrode 146 simultaneously. The source electrode 145 and the drain electrode 146 are substantially stepped shape. The etching barrier layer 147 is located at center of the channel layer 144 and is configured to protect the channel layer 144 from etching damage when forming the source electrode 145 and the drain electrode 146. The scan line 110 is electrically connected to the first gate electrode 1421 and the second gate electrode 1422, and is located on the base 141. The data line 120 is electrically connected to the source electrode 145, and is located on the insulating layer 143.

The channel layer 144 includes a first portion 1441 and a second portion 1442. The first portion 1441 and the second portion 1442 are arranged overlapping on the insulating layer 143. The second portion 1442 is sandwiched between the first portion 1441 and the insulating layer 143. The first portion 1441 covers an upper surface and sidewalls of the second portion 1442. Two opposite ends of the first portion 1441 is substantially stepped shaped. A length of the first portion 1441 is greater than a length of the etching barrier layer 147. Two opposite ends of the first portion 1441 are exposed from the etching barrier layer 147. The source electrode 145 partially covers an upper surface and a sidewall of the first portion 1441 exposed from the etching barrier layer 147, and the drain electrode 146 partially covers an upper surface and another sidewall of the first portion 1441 exposed from the etching barrier layer 147. The first portion 1441 includes a first region 1443 facing the first gate electrode 1421 and a second region 1445 facing the second gate electrode 1422. The first region 1443 is sandwiched between the source electrode 145 and the second portion 1442. The second region 1445 is sandwiched between the drain electrode 146 and the second portion 1442. In at least one embodiment, projections of the source electrode 145 and the drain electrode 146 on the insulating layer 143 are partly overlapping with the second portion 1442 respectively. The first portion 1441 is made of oxide semiconductor material, amorphous silicon or polycrystalline silicon semiconductor material. The second portion 1442 is made of conductive material, such as aluminum, titanium, molybdenum, tantalum, cooper, and so on. In other embodiments, the second portion 1442 is made of transparent conductive material, such as tin indium oxide (ITO), zinc indium oxide, and so on.

The first portion 1441 becomes conductive when voltages are provided on the first gate electrode 1421 and the second gate electrode 1421. A conductivity of the second portion 1442 is larger than a conductivity of the first portion 1441. An electron mobility of the second portion 1442 is larger than an electron mobility of the first portion 1441. When a voltage being provided to the TFT 140, based on the electron mobility and the conductivity of the first portion 1441 and the second portion 1442, a current of the source electrode 145 orderly passes the first region 1443, the second portion 1442, and the second region 1445 to the drain electrode 146. Meanwhile, a projection of the source electrode 145 on the insulating layer 143 is partly overlapping with the second portion 1442, thus a distance between the source electrode 145 and the second portion 1442 is decreased, and a distance between the drain electrode 146 and the second portion 1442 is decreased. Further, the second portion 1442 is used for establishing an electrical connection between the source electrode 145 and the drain electrode 146. As a result, a response speed of the TFT 140 is improved, and a weight of the TFT substrate 100 is decreased.

Figure 5:
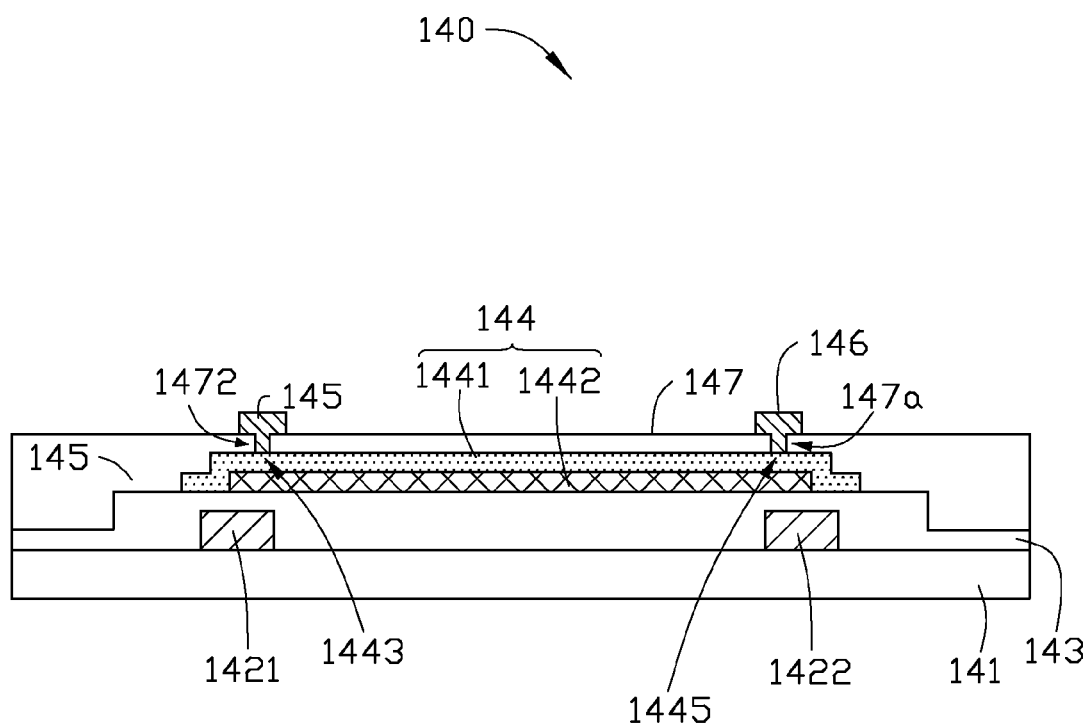
FIG. 5 is a cross-sectional view of a third embodiment of the TFT of FIG. 1.

FIG. 5 illustrates a third embodiment of the TFT 140. The TFT 140 includes a base 141, a first gate electrode 1421, a second gate electrode 1422, an insulating layer 143, a channel layer 144, a source electrode 145, a drain electrode 146, and an etching barrier layer 147. The first gate electrode 1421 and the second gate electrode 1422 are located on the base 141. The insulating layer 143 covers the base 141, the first gate electrode 1421, and the second gate electrode 1422. The channel layer 144 is located on an upper surface of the insulating layer 143 away from the base 141. The etching barrier layer 147 covers the insulating layer 143 and the channel layer 144. The etching layer 147 defines two through holes 1472 corresponding to opposite ends of the channel layer 144. The source electrode 145 and the drain electrode 146 are formed on the etching barrier layer 147, and are electrically connected to the channel layer 144 via the corresponding through holes 1472. The scan line 110 is electrically connected to the first gate electrode 1421 and the second gate electrode 1422, and is located on the base 141. The data line 120 is electrically connected to the source electrode 145, and is located on the insulating layer 143.

The channel layer 144 includes a first portion 1441 and a second portion 1442. The first portion 1441 and the second portion 1442 are arranged overlapping on the insulating layer 143. The second portion 1442 is sandwiched between the first portion 1441 and the insulating layer 143. The first portion 1441 covers an upper surface and sidewalls of the second portion 1442. Two opposite ends of the first portion 1441 are substantially stepped shaped. The first portion 1441 includes a first region 1443 facing the first gate electrode 1421 and a second region 1445 facing the second gate electrode 1422. A thickness of the second portion 1442 is larger than a thickness of the first portion 1441. The first region 1443 is sandwiched between the source electrode 145 and the second portion 1442. The second region 1445 is sandwiched between the drain electrode 146 and the second portion 1442. In at least one embodiment, projections of the source electrode 145 and the drain electrode 146 on the insulating layer 143 are partly overlapping with the second portion 1442 respectively. The first portion 1441 is made of oxide semiconductor material, amorphous silicon or polycrystalline silicon semiconductor material. The second portion 1442 is made of conductive material, such as aluminum, titanium, molybdenum, tantalum, cooper, and so on. In other embodiments, the second portion 1442 is made of transparent conductive material, such as tin indium oxide (ITO), zinc indium oxide, and so on.

The first portion 1441 becomes conductive when voltages are provided on the first gate electrode 1421 and the second gate electrode 1421. A conductivity of the second portion 1442 is larger than a conductivity of the first portion 1441. An electron mobility of the second portion 1442 is larger than an electron mobility of the first portion 1441. When a voltage being provided to the TFT 140, based on the electron mobility and the conductivity of the first portion 1441 and the second portion 1442, a current of the source electrode 145 orderly passes the first region 1443, the second portion 1442, and the second region 1445 to the drain electrode 146. Meanwhile, a shortest distance between the source electrode 145 and the second portion 1442 is from the source electrode 145 projected on the insulating layer 143 to the second portion 1442, and a shortest distance between the drain electrode 146 and the second portion 1442 is from the drain electrode 146 projected on the insulating layer 143 to the second portion 1442. Further, the second portion 1442 is used for establishing an electrical connection between the source electrode 145 and the drain electrode 146. As a result, a response speed of the TFT 140 is improved, and a weight of the TFT substrate 100 is decreased.

While various exemplary and preferred embodiments have been described, the disclosure is not limited thereto. On the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A thin film transistor (TFT) comprising:
a first gate electrode located on a base;
a second gate electrode located on the base, and configured to being insulated from the first gate electrode;
an insulating layer covering the base, the first gate electrode, and the second gate electrode;
a source electrode;
a drain electrode; and
a channel layer located on the insulating layer, and comprising a first portion being a semi-conductive layer and a second portion being a conductive layer sandwiched between the first portion and the insulating layer,
wherein a conductivity of the second portion is larger than a conductivity of the first portion being conductive;
the first portion comprises a first region facing the first gate electrode and a second region facing the second gate electrode; and
the source electrode is electrically connected to the first region, and the drain electrode is electrically connected to the second region.

2. The TFT of claim 1, wherein the first portion covers an upper surface and sidewalls of the second portion.

3. The TFT of claim 1, wherein two opposite ends of the first portion is substantially stepped shape.

4. The TFT of claim 1, wherein the source electrode and the drain electrode are formed on the channel layer; the source electrode covers an end of the first portion, and the drain electrode covers an opposite end of the first portion.

5. The TFT of claim 1, wherein the source electrode and the drain electrode are substantially stepped shape.

6. The TFT of claim 1, wherein projections of the source electrode and the drain electrode on the insulating layer are partly overlapping with the second portion respectively.

7. The TFT of claim 1, wherein a thickness of the second portion is larger than a thickness of the first portion.

8. The TFT of claim 1, further comprising an etching barrier layer; wherein the etching barrier layer is located on the channel layer; the source electrode covers an end of the channel layer and an end of the etching barrier layer adjacent to the end of the channel layer covered by the source electrode simultaneously; the drain electrode covers another end of the channel layer and another end of the etching barrier layer adjacent to the another end of the channel layer covered by the drain electrode simultaneously.

9. The TFT of claim 8, wherein a length of the first portion is larger than a length of the etching barrier layer; two opposite ends of the first portion are exposed from the etching barrier layer.

10. The TFT of claim 1, further comprising an etching barrier layer; wherein the etching barrier layer covers the insulating layer and the channel layer; the etching barrier layer defines two through holes; the source electrode and the drain electrode are formed on the etching barrier layer, and are electrically connected to the first portion via passing the corresponding through holes.

11. A thin film transistor (TFT) substrate comprising:
a plurality of scan lines parallel with each other;
a plurality of data lines parallel with each other and configured to insulate from the scan lines;
a plurality of pixel regions defined by the intersecting scan lines and the data lines; and
a plurality of TFTs located at the intersection of the scan lines and the data lines; the TFT comprising:
a first gate electrode located on a base;
a second gate electrode located on the base, and configured to insulate from the first gate electrode;
an insulating layer covered on the base, the first gate electrode, and the second gate electrode;
a source electrode;
a drain electrode; and
a channel layer located on the insulating layer, and comprising a first portion being a semiconductive layer and a second portion being a conductive layer sandwiched between the first portion and the insulating layer;
wherein a conductivity of the second portion is larger than a conductivity of the first portion being conductive; the first portion comprises a first region facing the first gate electrode and a second region facing the second gate electrode; the source electrode is electrically connected to the first region, and the drain electrode is electrically connected to the second region.

12. The TFT substrate of claim 11, wherein the first portion covers an upper surface and sidewalls of the second portion.

13. The TFT substrate of claim 11, wherein two opposite ends of the first portion is substantially stepped shape.

14. The TFT substrate of claim 11, wherein the source electrode and the drain electrode are formed on the channel layer; the source electrode covers an end of the first portion, and the drain electrode covers an opposite end of the first portion source electrode.

15. The TFT substrate of claim 11, wherein the source electrode and the drain electrode are substantially stepped shape.

16. The TFT substrate of claim 11, wherein projections of the source electrode and the drain electrode on the insulating layer are partly overlapping with the second portion respectively.

17. The TFT substrate of claim 11, wherein a thickness of the second portion is larger than a thickness of the first portion.

18. The TFT substrate of claim 11, further comprising an etching barrier layer; wherein the etching barrier layer is located on the channel layer; the source electrode covers an end of the channel layer and an end of the etching barrier layer adjacent to the end of the channel layer covered by the source electrode simultaneously; the drain electrode covers another end of the channel layer and another end of the etching barrier layer adjacent to the another end of the channel layer covered by the drain electrode simultaneously.

19. The TFT substrate of claim 18, wherein a length of the first portion is larger than a length of the etching barrier layer; two opposite ends of the first portion are exposed from the etching barrier layer.

20. The TFT substrate of claim 11, further comprising an etching barrier layer; wherein the etching barrier layer covers on the insulating layer and the channel layer; the etching barrier layer defines two through holes; the source electrode and the drain electrode are formed on the etching barrier layer, and are electrically connected to the first portion via passing the corresponding through hole.

* * * * *